United States Patent
Guo

(10) Patent No.: US 10,522,589 B2
(45) Date of Patent: Dec. 31, 2019

(54) METHOD OF MAKING A MAGNETORESISTIVE ELEMENT

(71) Applicant: Yimin Guo, San Jose, CA (US)

(72) Inventor: Yimin Guo, San Jose, CA (US)

(73) Assignee: Shanghai Ciyu Information Technologies Co., Ltd., Shanghai (CN)

( * ) Notice: Subject to any disclaimer, the term of this patent is extended or adjusted under 35 U.S.C. 154(b) by 0 days.

(21) Appl. No.: 14/073,844

(22) Filed: Nov. 6, 2013

(65) Prior Publication Data

US 2014/0175581 A1    Jun. 26, 2014

Related U.S. Application Data

(60) Provisional application No. 61/745,757, filed on Dec. 24, 2012.

(51) Int. Cl.
*H01L 27/22* (2006.01)
*H01L 43/12* (2006.01)
*H01L 43/00* (2006.01)

(52) U.S. Cl.
CPC .......... *H01L 27/222* (2013.01); *H01L 27/224* (2013.01); *H01L 43/00* (2013.01); *H01L 43/12* (2013.01)

(58) Field of Classification Search
CPC ...... H01L 27/222; H01L 27/224; H01L 43/00
USPC .......... 257/108, E43.001, E43.005, E43.006, 257/E27.006, E29.167, E21.665
See application file for complete search history.

(56) References Cited

U.S. PATENT DOCUMENTS

| | | | | |
|---|---|---|---|---|
| 2005/0185455 A1* | 8/2005 | Huai | ............ | 365/171 |
| 2008/0164547 A1* | 7/2008 | Higo et al. | ............ | 257/421 |
| 2008/0191295 A1* | 8/2008 | Ranjan et al. | ............ | 257/421 |
| 2009/0080239 A1* | 3/2009 | Nagase et al. | ............ | 365/158 |
| 2012/0119181 A1* | 5/2012 | Oh et al. | ............ | 257/4 |
| 2012/0300542 A1* | 11/2012 | Uchida et al. | ............ | 365/171 |
| 2013/0119498 A1* | 5/2013 | Huai et al. | ............ | 257/421 |
| 2013/0130063 A1* | 5/2013 | Choi et al. | ............ | 428/828 |
| 2014/0042567 A1* | 2/2014 | Jung et al. | ............ | 257/421 |

* cited by examiner

*Primary Examiner* — Eduardo A Rodela
(74) *Attorney, Agent, or Firm* — Chein-Hwa Tsao; YuanHui Huang; 5Suns/WorldPatent.Agency

(57) ABSTRACT

A magnetoresistive element comprises a novel Boron-absorbing cap multilayer provided on the top surface of an amorphous CoFeB (or CoB, FeB) ferromagnetic recording layer. As the magnetoresistive film is thermally annealed, a crystallization process occurs to form bcc CoFe grains having epitaxial growth with (100) plane parallel to the surface of the tunnel barrier layer as Boron elements migrate into the novel cap layer. Removing the top portion of the cap layer by means of sputtering etch or RIE etch processes followed by optional oxidization process, a thin thermally stable portion of cap layer is remained on top of the recording layer with low damping constant. Accordingly, a reduced write current is achieved for spin-transfer torque MRAM application.

2 Claims, 2 Drawing Sheets

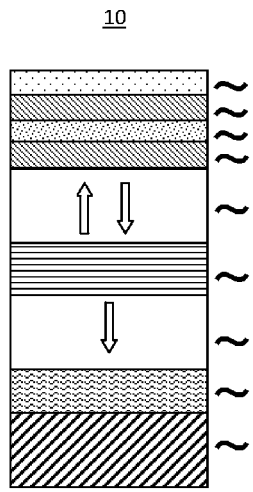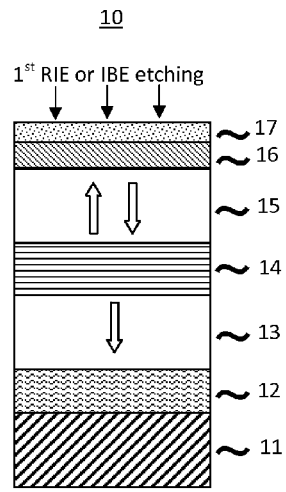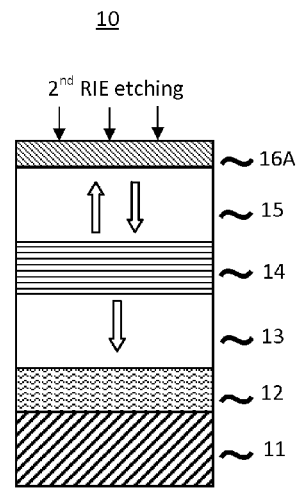
FIG. 4A  FIG. 4B  FIG. 4C
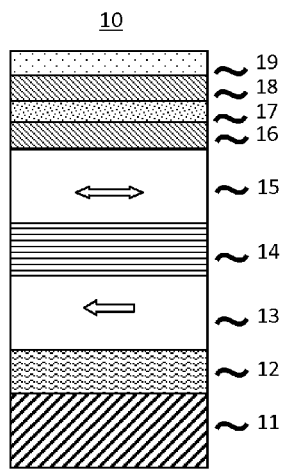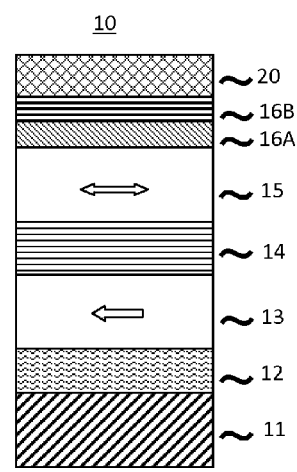
FIG. 5  FIG. 6

METHOD OF MAKING A MAGNETORESISTIVE ELEMENT

RELATED APPLICATIONS

This application claims the priority benefit of U.S. Provisional Application No. 61/745,757, filed on Dec. 24, 2012, which is incorporated herein by reference.

BACKGROUND OF THE INVENTION

1. Field of the Invention

This invention relates to the field of magnetoresistive elements. More specifically, the invention comprises spin-transfer-torque magnetic-random-access memory (MRAM) using magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element (equivalently referred to as the "magnetoresistive element"), both two magnetization films have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a bcc or hcp-phase cap layer that sandwich a thin recoding layer having an amorphous CoFeB ferromagnetic film and accelerate crystallization of the amorphous ferromagnetic film to match interfacial grain structure to MgO layer through a thermal annealing process. The recording layer crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunneling junction structure is formed. By using this technique, a high MR ratio can be achieved.

However, where a cap layer is used for achieving a high MR ratio in an MTJ element, the cap layer may increase the damping constant of the recording layer, due to the so-called spin-pumping effect. Further, the damping constant of the recording layer may also increase from the additional cap layer material diffusion during the heat treatment in the device manufacturing process.

In a spin-injection MRAM using either a perpendicular or planar magnetization film, a write current is proportional to the damping constant and inversely proportional to a spin polarization. Therefore, reduction of the damping constant and increase of the spin polarization are mandatory technologies to reduce the write current.

BRIEF SUMMARY OF THE PRESENT INVENTION

The present invention comprises perpendicular magnetoresistive elements and methods of manufacturing such perpendicular magnetoresistive elements for perpendicular spin-transfer-torque MRAM.

The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The perpendicular magnetoresistive element comprises: a reference layer having magnetic anisotropy in a direction perpendicular to a film surface of the reference layer and having an invariable magnetization direction; a tunnel barrier layer on the reference layer; a recording layer having magnetic anisotropy in a direction perpendicular to a film surface of the reference layer and having a variable magnetization direction on the tunnel barrier layer; and a "crystalline structural quality and magnetic anisotropy enhancement bilayer" (CSMAE bilayer) comprising a recording layer and a novel cap multilayer (equivalently referred to as the "cap layer" or the "impurity absorbing layer") provided on a surface of the recording layer, wherein at least the top portion of the cap multilayer (a sacrificial layer) is later removed after conducting a thermal annealing process on the magnetoresistive film and leaves a thermally stable bottom cap layer interfacing to the recording layer.

As an amorphous ferromagnetic material, like CoFeB, in the recording layer is thermally annealed, a crystallization process occurs to form bcc CoFe grains having epitaxial growth with (100) plane parallel to the surface of the tunnel barrier layer to form a perpendicular anisotropy as Boron elements migrate into the Boron-absorbing cap layer. Removing the top portion of the cap layer by means of sputtering etching including ion bean etching (IBE) or reactive ion etching (RIE) process(es) followed by an optional oxidization process, a thin thermally stable portion of cap layer is preserved on top of the recording layer, accordingly, a recording layer having a low damping constant and a reduced write current is achieved.

The present invention also comprises planar magnetoresistive elements and methods of manufacturing such planar magnetoresistive elements for planar, also known as parallel (parallel to a film surface of the reference layer), spin-transfer-torque MRAM.

BRIEF DESCRIPTION OF THE DRAWINGS

FIG. 4A is a cross-sectional view showing a configuration of an MTJ element 10 as deposited, according to the third embodiment;

FIG. 4B is a cross-sectional view showing a configuration of an MTJ element 10 after the $1^{st}$ RIE or IBE etching process to remove the protective layer and the third cap sub-layer (equivalently referred to as the "third impurity absorbing sub-layer"), according to the third embodiment;

FIG. 4C is a cross-sectional view showing a configuration of an MTJ element 10 after the $2^{nd}$ RIE etching process to remove the second cap sub-layer, according to the third embodiment;

FIG. 5 is a cross-sectional view showing a configuration of an MTJ element 10 as deposited, according to the fourth embodiment;

FIG. 6 is a cross-sectional view showing a configuration of an MTJ element 10 after an optional top surface oxidization of the remaining first cap sub-layer (equivalently referred to as the "first impurity absorbing sub-layer"), followed by deposition of a upper-contact layer film comprising a buffer layer and a photoresist layer, according to the fourth embodiment.

DETAILED DESCRIPTION OF THE INVENTION

In general, according to one embodiment, there is provided a magnetoresistive element comprising:

a reference layer having magnetic anisotropy and having an invariable magnetization direction;

a tunnel barrier layer provided on the reference layer;

a recording layer provided on the tunnel barrier layer and having a variable magnetization direction;

a cap multilayer provided on the top surface of the recording layer;

a protective layer provided on the top surface of the cap multilayer, wherein the protective layer and at least the top portion of the cap multilayer are later removed after conducting a thermal annealing process on the magnetoresistive film and leaves a thermally stable bottom cap multilayer interfacing to the recording layer;

an optional oxidization process provided to oxidize the top surface of the remaining cap layer;

and an upper-contact layer provided on the remaining cap layer, comprising a buffer layer and a photoresist layer for further photo-lithographic processes of a magnetoresistive element.

First Embodiment

Figure 1A:
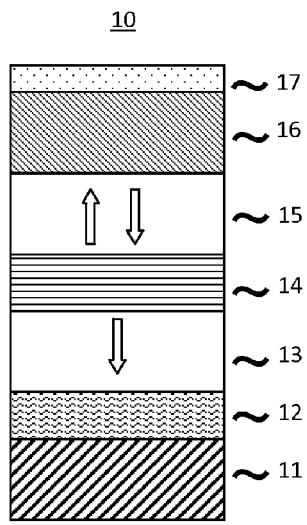
FIG. 1A is a cross-sectional view showing a configuration of an MTJ element 10 as deposited, according to the first embodiment.

FIG. 1 is a cross-sectional view showing a configuration of an MTJ element 10 as deposited according to the first embodiment. The MTJ element 10 is configured by stacking a bottom electrode 11, a base layer (equivalently referred to as the "seed layer") 12, a reference layer 13, a tunnel barrier layer 14, a recording layer 15, a cap layer 16, and a protective layer 17 in this order from the bottom.

The reference layer 13 and the recording layer 15 are made of a ferromagnetic material, and have uni-axial magnetic anisotropy in a direction perpendicular to the film surfaces. Further, directions of easy magnetization of the reference layer 13 and the recording layer 15 are also perpendicular to the film surfaces. In other words, the MTJ element 10 is a perpendicular MTJ element in which magnetization direction of the reference layer 13 and the recording layer 15 face in a direction perpendicular to the film surfaces. A direction of easy magnetization is a direction in which the internal magnetic energy is at its minimum where no external magnetic field exists. Meanwhile, a direction of hard magnetization is a direction in which the internal energy is at its maximum where no external magnetic field exists.

The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged. An MTJ element 10 which comprises a recording layer 15 having a variable magnetization direction and a reference layer 13 having an invariable magnetization direction for a predetermined write current can be achieved.

The tunnel barrier layer 14 is made of a non-magnetic insulating metal oxide or nitride.

The cap layer 16 is a low electro-negativity and low diffusivity metal layer or a metal alloy layer having a bcc or hcp-phase and having at least a thickness of 50 angstroms. The cap layer serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate into the cap layer having a low electro-negativity. A damping constant of the recording layer 15 sometimes increases (deteriorates) depending on a material in contact with the recording layer 15, which is known as a spin pumping effect. The cap layer 16 may also have a function to prevent increase of the damping constant of the recording layer 15 by reducing the spin pumping. Further, the thickness of the cap layer 15 is selected to be big enough that it serves as a good absorber for the Boron elements from the recording layer to achieve better epitaxial CoFe crystal grains in the recoding layer having an ultra-low damping constant.

An example configuration of the MTJ element 10 will be described below. The reference layer 13 is made of CoFeB (around 2 nm)/TbCoFe(around 20 nm). The tunnel barrier layer 14 is made of MgO(around 1 nm). The recording layer 15 is made of CoFeB(around 1.2 nm). The cap layer 16 is made of Ti(around 10 nm). The protective layer 17 is made of Ru(around 10 nm). The base layer 12 is made of Ta(around 20 nm)/Cu(around 20 nm)/Ta(around 20 nm). Each element written in the left side of "/" is stacked above an element written in the right side thereof.

The CoFeB (with Boron content no less than 10% and no more than 30%) layer comprised in the recording layer 15 is in an amorphous state as deposited. The MgO layer comprised in the tunnel barrier layer 14 is formed into rocksalt crystal grains with the (100) plane parallel to the substrate plane. During a thermal annealing with a temperature higher than 250-degree C., the Boron elements of the CoFeB migrate into its above Ti cap layer to form TiB2 since Ti has much lower electro-negativity than Co and Fe, and the amorphous CoFeB is crystallized to form bcc CoFe grains having epitaxial growth with (100) plane parallel to the surface of the MgO crystal tunnel barrier layer. A thick Ti cap layer is essential to absorb as many as Boron atoms as possible and achieve better epitaxial bcc CoFe crystal grains. A relatively pure CoFe film has a lower damping constant than an amorphous CoFeB film. A typical damping constant for a pure CoFe is around 0.003, while CoFeB has a damping constant of 0.01. Accordingly, a perpendicular magnetization having a low damping constant is induced in the recording layer.

Figure 1B:
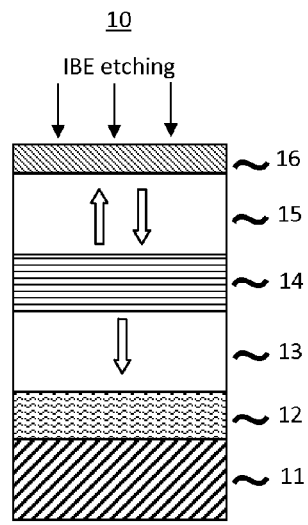
FIG. 1B is a cross-sectional view showing a configuration of an MTJ element 10 after IBE etching process to remove the protective layer and top portion of the cap layer, according to the first embodiment.

After the thermal annealing process, an IBE etching process is adopted to etch away the Ru protective layer and the top portion of the Ti cap layer, leaving a much thinner remaining Ti cap layer for an easy integration with very small dimension lithographic patterning process, as shown in FIG. 1B. An upper contact layer 19 (not shown) comprising a buffer layer and a photoresist layer is then deposited on the top of MTJ film after the etching.

Figure 2:
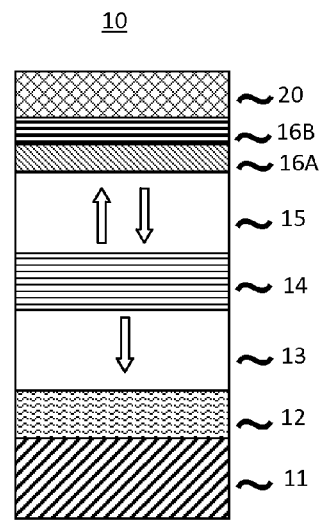
FIG. 2 is a cross-sectional view showing a configuration of an MTJ element 10 after an optional top surface oxidization of the remaining cap layer, followed by deposition of a upper-contact layer film comprising a buffer layer and a photoresist layer.

An surface oxidization process is added upon necessity before the upper contact layer deposition. A surface oxidization process, i.e. by using of a mixed gas containing natural oxygen (O.sub.2), or radical oxygen and Argon (Ar), may also be adopted before the deposition of the upper contact layer. Doing so, a thin oxide layer 16B is formed between the remaining cap layer 16A and the upper contact layer 20 for better interfacial thermal stability and less diffusion. The final configuration of the MTJ element 10, which is ready for MTJ element photolithographic patterning process, is shown in FIG. 2. After all above processes, the remained portion of the impurity absorbing layer is called "magic layer", that has a significantly reduced thickness.

Second Embodiment

Figure 3A:
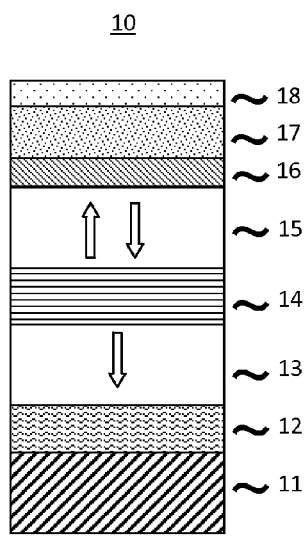
FIG. 3A is a cross-sectional view showing a configuration of an MTJ element 10 as deposited, according to the second embodiment.

FIG. 3A is a cross-sectional view showing an example configuration of the MTJ element 10 as deposited according to the second embodiment. As shown in FIG. 3A, the reference layer 13 is made of CoFeB(around 2 nm)/TbCoFe (around 20 nm). The tunnel barrier layer 14 is made of MgO(around 1 nm). The recording layer 15 is made of CoFeB (around 1.2 nm). The first cap sub-layer (equivalently referred to as the "first impurity absorbing sub-layer") 16 is made of Ti(around 2 nm). The second cap sub-layer (equivalently referred to as the "second impurity absorbing sub-layer") 17 is made of Ta(around 10 nm). The protective layer 18 is made of Ru(around 10 nm). The base layer is made of Ta(around 20 nm)/Cu(around 20 nm)/Ta(around 20 nm). Each element written in the left side of "/" is stacked above an element written in the right side thereof.

Similar to the first embodiment, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and further across Ti cap sub-layer into the Ta cap sub-layer 17, since Ta atom has a even lower electro-negativity and a stronger Boron-bonding than Ti atom. The ionicity of metal-Boron bonds decreases in the following order: Mg, Al, Mn, Y, Cr, Zr, Hf, Nb, Ta, V and Ti. Accordingly, the amorphous CoFeB in the recording layer is crystallized to form bcc CoFe grains having epitaxial growth with (100) plane parallel to surface of the MgO crystal tunnel barrier layer, and a perpendicular magnetization having a low damping constant is induced in the recording layer.

Figure 3B:
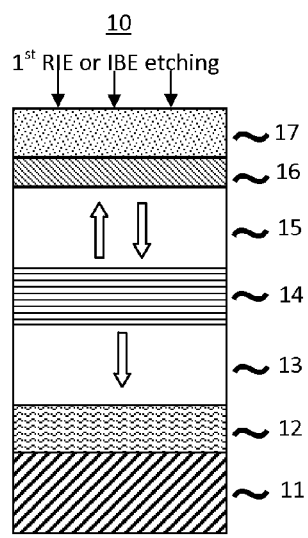
FIG. 3B is a cross-sectional view showing a configuration of an MTJ element 10 after the $1^{st}$ RIE or IBE etching process to remove the protective layer, according to the second embodiment.
Figure 3C:
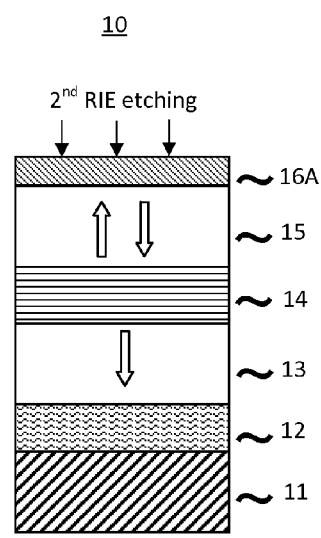
FIG. 3C is a cross-sectional view showing a configuration of an MTJ element 10 after the $2^{nd}$ RIE etching process to remove the second cap sub-layer (equivalently referred to as the "second impurity absorbing sub-layer"), according to the second embodiment.

After the thermal annealing process, a RIE etching process utilizing CH3OH gas, or NH3+CO mixed gas chemistry can be employed to etch away the protective Ru layer 18 and the second cap Ta sub-layer serves as its etch-stop layer, as shown in FIG. 3B. Alternatively, an IBE etching process is utilized to etch away the protective Ru layer 18 and the upper portion of the second cap Ta sub-layer 17. The remaining Ta cap sub-layer is readily removed by the $2^{nd}$ RIE etching process utilizing CF4 gas chemistry, leaving a thin Ti first cap sub-layer, as shown in FIG. 3C, for an easy integration with very small dimension lithographic patterning process. Following an optional surface oxidization process, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Third Embodiment

FIG. 4A is a cross-sectional view showing an example configuration of the MTJ element 10 according to the third embodiment. As shown in FIG. 4A, the reference layer 13 is made of CoFeB(around 2 nm)/TbCoFe(around 20 nm). The tunnel barrier layer 14 is made of MgO(around 1 nm). The recording layer 15 is made of CoFeB(around 1.2 nm). The first cap sub-layer 16 is made of Ti(around 2 nm). The second cap sub-layer 17 is made of Ta(around 3 nm). The third cap sub-layer layer (equivalently referred to as the "third impurity absorbing sub-layer") 18 is made of Hf(around 10 nm). The protective layer is made of Ru(around 10 nm). The base layer is made of Ta(around 20 nm)/Cu(around 20 nm)/Ta(around 20 nm). Each element written in the left side of "/" is stacked above an element written in the right side thereof.

Similar to the first and second embodiments, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and thin Ta cap sub-layer 17, and further across them into the Hf cap sub-layer 18, since Hf atom has a even lower electro-negativity and a stronger Boron-bond than both of Ti atom and Ta atom. From the first cap sub-layer to the third cap sub-layer, the bond iconicity with Boron atom gradually increases and more effectively attracts or absorbs Boron elements from the CoFeB recording layer. Accordingly, the amorphous CoFeB in the recording layer is crystallized to form better bcc CoFe grains having epitaxial growth with (100) plane parallel to surface of the MgO crystal tunnel barrier layer, and a perpendicular magnetization having a low damping constant is induced in the recording layer.

After the thermal annealing process, the $1^{st}$ RIE etching process using CH3OH gas, or NH3+Co mixed gas chemistry is employed to etch away the protective Ru layer 19 and the third cap Hf sub-layer 18, stopping at Ta cap sub-layer 17, as shown in FIG. 4B. The remaining Ta cap sub-layer is then readily removed by the $2^{nd}$ RIE etching process using CF4 gas chemistry, leaving a thin Ti first cap sub-layer, as shown in FIG. 4C, for an easy integration with very small dimension lithographic patterning process. Following an optional surface oxidization process, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Fourth Embodiment

Similar to above embodiments, the same cap multilayer can be adopted in a planar magnetoresistive element. FIG. 5 is a cross-sectional view showing an example configuration of the MTJ element 10 according to the fourth embodiment. All layered configuration can be identical to those of the third embodiment, except that the reference layer has an invariable magnetization in a direction parallel to a film surface and the recording layer has a variable magnetization in a direction parallel to a film surface. After the same thermal annealing and etching processes are utilized, the final configuration of the MTJ element 10, which is ready for MTJ element photolithographic patterning process, is shown in FIG. 6.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
 a seed layer;
 a reference layer, atop the seed layer, having a magnetic anisotropy with an invariable magnetization direction;
 a tunnel barrier layer atop the reference layer; and
 a magic recording layer, atop the tunnel barrier layer, having a magnetic anisotropy with a variable magnetization direction, comprising:
  2a) a recording layer comprising one or more of subsidiary recording layer(s) comprising:
   2a1) a number of ferromagnetic elements necessary for forming a magnetic anisotropy therein, ideally made by materials comprising Cobalt and Iron; plus
   2a2) a minimum number of crystalline structural quality enhancement (CSQE) elements comprising Boron, in form(s) including but not limited to one or more of CoFeB and a mixture of CoB and FeB, ideally with a ratio of Boron over a recording layer compound less than 10%; and
  2b) a magic layer, atop the recording layer, comprising a first subsidiary magic layer (interchangeably magic sub-layer) composed of Titanium atop the recording layer;
   a second subsidiary magic layer (interchangeably magic sub-layer) composed of Tantalum atop the first magic sub-layer; and
   a third subsidiary magic layer (interchangeably magic sub-layer) composed of Hafnium atop the second subsidiary magic layer, wherein each subsidiary magic layer is formed by a magic process of
   2b1) enhancing the crystalline structural quality, hence fabrication yield, of a resulting magnetoresistive element; and
   2b2) enhancing the magnetic anisotropy of the recording layer whereby achieving a high MR ratio for the magnetoresistive element with a simultaneous reduction of an undesirable spin pumping effect.

2. The element of claim 1 wherein the magic recording layer is a remaining layer from an etching processing, followed by an oxidization on the surface, for removing a significant top portion of a crystalline structural quality and magnetic anisotropy enhancement bilayer (CSMAE bilayer), formed atop the tunnel barrier layer as an element in process with an interim thickness and is treated by annealing comprising a heating process at a temperature higher than 250 degrees Celsius, wherein the CSMAE comprises an impurity absorbing layer and the recording layer with CSQE composition percentage from 10% up to 30%, ideally 20% and only the top portion of the impurity absorbing layer is removed by an etching process followed by an oxidization process atop the remaining layer, whereby the CSQE composition percentage within the device becomes less than 10% and the thickness of the remained portion of the impurity absorbing layer, i.e., the magic layer, less than 100 angstroms becomes achievable, wherein the impurity absorbing layer comprises one or more impurity absorbing sub-layers with a first impurity absorbing sub-layer atop the recording layer and each subsequent impurity absorbing sub-layer atop its preceding impurity absorbing sub-layer, wherein the impurity absorbing sub-layers comprises:
 a first impurity absorbing sub-layer composed of Titanium atop the recording layer;
 a second impurity absorbing sub-layer composed of Tantalum atop the first impurity absorbing sub-layer; and
 a third impurity absorbing sub-layer composed of Hafnium atop the second impurity absorbing sub-layer.

* * * * *